(12) United States Patent
Yoshida

(10) Patent No.: US 10,665,464 B2
(45) Date of Patent: May 26, 2020

(54) PROCESS OF FORMING FIELD EFFECT TRANSISTOR

(71) Applicant: SUMITOMO ELECTRIC INDUSTRIES, LTD., Osaka (JP)

(72) Inventor: Tomohiro Yoshida, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/267,249

(22) Filed: Feb. 4, 2019

(65) Prior Publication Data

US 2019/0244823 A1 Aug. 8, 2019

(30) Foreign Application Priority Data

Feb. 5, 2018 (JP) .................... 2018-018291
Mar. 19, 2018 (JP) .................... 2018-050653
Jul. 20, 2018 (JP) .................... 2018-137070

(51) Int. Cl.

| H01L 21/285 | (2006.01) |
|---|---|
| H01L 29/423 | (2006.01) |
| H01L 29/66 | (2006.01) |
| H01L 29/778 | (2006.01) |
| H01L 23/29 | (2006.01) |
| H01L 29/40 | (2006.01) |
| H01L 29/20 | (2006.01) |

(52) U.S. Cl.
CPC ...... H01L 21/28593 (2013.01); H01L 23/291 (2013.01); H01L 29/401 (2013.01); H01L 29/42316 (2013.01); H01L 29/66462 (2013.01); H01L 29/7787 (2013.01); *H01L 29/2003* (2013.01)

(58) Field of Classification Search
CPC ............ H01L 21/28593; H01L 23/291; H01L 29/401; H01L 29/42316; H01L 29/66462; H01L 29/7787; H01L 29/2003
USPC ........................................................ 438/585
See application file for complete search history.

(56) References Cited

U.S. PATENT DOCUMENTS

| 2007/0267655 A1 | 11/2007 | Endoh et al. |
| 2012/0119260 A1 | 5/2012 | Radulescu et al. |
| 2013/0083568 A1 | 4/2013 | Makiyama et al. |

FOREIGN PATENT DOCUMENTS

| JP | 2013-77621 | 4/2013 |
| JP | 2013-222939 | 10/2013 |
| WO | 2006/080109 | 8/2006 |

*Primary Examiner* — Elias Ullah
(74) *Attorney, Agent, or Firm* — Smith, Gambrell & Russell, LLP.

(57) ABSTRACT

A process of forming a field effect transistor is disclosed. The process includes steps of depositing a first silicon nitride (SiN) film on a semiconductor layer by a low pressure chemical vapor deposition (LPCVD) technique; depositing a second SiN film on the first SiN film by plasma assisted chemical vapor deposition (p-CVD) technique; preparing a photoresist mask on the second SiN film, the photoresist mask having an opening in a position corresponding to the gate electrode; dry-etching the second SiN film and the first SiN film continuously in a portion of the opening in the photoresist mask to form an opening in the first SiN film and an opening in the second SiN film, the openings in the first and second SiN films exposing the semiconductor layer; and filling at least the opening in the first SiN film by the gate electrode. A feature of the process is that the opening in the first SiN film has an inclined side against the semiconductor layer and gradually widens from the semiconductor layer.

16 Claims, 14 Drawing Sheets

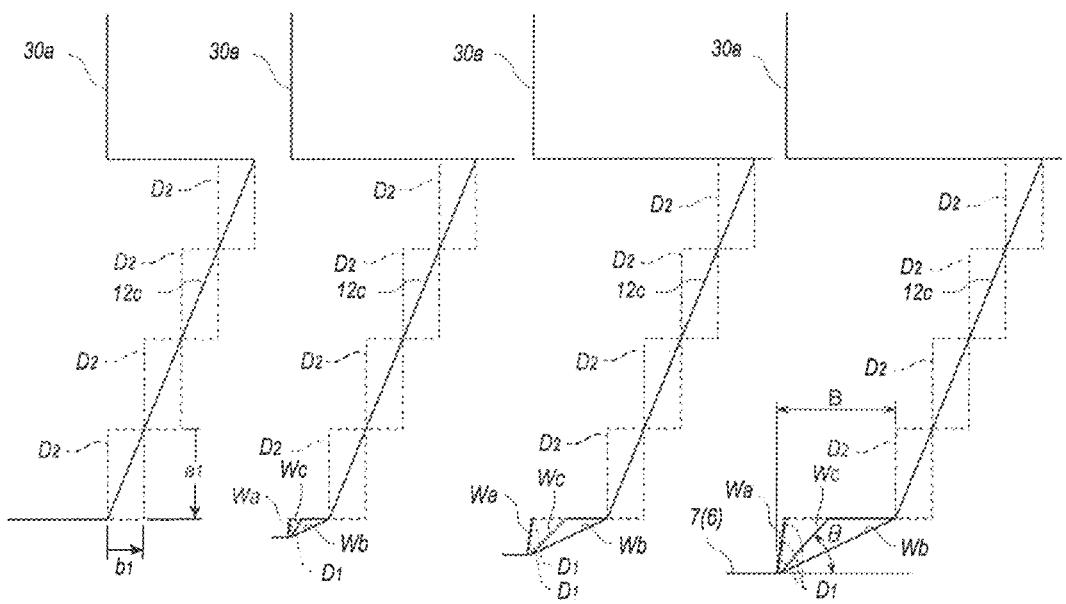

PROCESS OF FORMING FIELD EFFECT TRANSISTOR

CROSS REFERENCE TO RELATED APPLICATIONS

This application claims priority benefit of Japanese Patent Applications, JP2018-018291 filed on Feb. 5, 2018, and JP2018-050653 filed on Mar. 19, 2018, and JP2018-137070 filed on Jul. 20, 2018; the disclosures of which are hereby incorporated by reference in its entirety.

BACKGROUND OF INVENTION

1. Field of Invention

The present invention relates to a process of forming a field effect transistor (FET), in particular, the invention relates to a process of forming a gate electrode of an FET.

2. Background Arts

A United States patent, US 2012/119260A1 has disclosed a process of forming an electrode on a semiconductor layer. The process disclosed therein first deposits a base insulating film on the semiconductor layer, then, forms an opening in the base insulating film to expose the semiconductor layer partially. Thereafter, another insulating film, denoted as the first insulating film, covers the whole surface of the base insulating film and that of the semiconductor layer exposed within the opening in the base insulating film. Then, another insulating film denoted as the second insulating film covers the whole surface of the first insulating film, where the first and second insulating films in cross sections thereof reflect a shape of the opening in the base insulating film. The first and second insulating films are partly etched to form an opening so as to expose the semiconductor layer therein and to be left in a side of the base insulating film in the opening thereof to form an inclined side thereof. The electrode fills the opening in the first and second insulating films.

A Japanese Patent Application laid open No. JP2013-077621A has disclosed a semiconductor device primarily made of compound semiconductor materials. The semiconductor device disclosed therein provides a semiconductor stack on a substrate of silicon carbide (SiC), a passivation film of silicon nitride (SiN) on the semiconductor stack, where the passivation film provides an opening, and a gate electrode that fills the opening in the passivation film. The opening is formed by wet-etching the passivation film to make sides of the opening inclined against the semiconductor stack.

Another Japanese Patent Application laid open No. JP2013-222939A has disclosed a semiconductor device type of high electron mobility transistor (HEMT) that provides a flange in the gate electrode. The flange is not in direct contact with the semiconductor stack and shows a function to moderate the field strength concentrated on the edge of the gate electrode. The HEMT in one of embodiments disclosed therein provides the flange with two portions, one of which is provided on a SiN passivation film which is the first insulating film, while, another is provided on a second insulating film made of hafnium oxide (HfO). The flange with two or more portions may enhance the function to moderate or disperse the field strength of the gate electrode.

A gate electrode of an FET preferably has a cross section gradually increasing a width thereof as apart from the semiconductor layer in order to moderate the field strength concentrating on an edge of the electrode and to reduce a drain current collapse. Prior patent documents described above have proposed various techniques to form a side of an opening in the passivation film inclined with respect to the semiconductor surface and to form a flange not in direct contact with the semiconductor layer. However, such processes are not definitive because those processes show complexity and inherently bring large dispersion in the inclined angle of the side of the opening.

SUMMARY OF INVENTION

An aspect of the present invention relates to a process of forming a field effect transistor (FET) that provides a gate electrode. The process of the invention comprises steps of: (a) depositing a first silicon nitride (SiN) film on a semiconductor layer by a low pressure chemical vapor deposition (LPCVD) technique; (b) depositing a second SiN film on the first SiN film by plasma 30o assisted chemical vapor deposition (p-CVD) technique; (c) preparing a photoresist mask on the second SiN film, where the photoresist mask has an opening in a position corresponding to the gate electrode; (d) dry-etching the second SiN film and the first SiN film continuously in a portion of the opening of the photoresist mask to form an opening in the first SiN film and another opening in the second SiN film, the openings in the first and second SiN films exposing the semiconductor layer therein; and (e) filling at least the opening of the first SiN film by the gate electrode. A feature of the process of the invention is that the opening of the first SiN film has an inclined side against the semiconductor layer and gradually widens from the semiconductor layer.

BRIEF DESCRIPTION OF DRAWINGS

The foregoing and other purposes, aspects and advantages will be better understood from the following detailed description of a preferred embodiment of the invention with reference to the drawings, in which:

FIG. 6A to FIG. 6D schematically explain retreat of an edge of the second SiN film and formation of an inclined edge of the first SiN film during the formation of the opening in the first SiN film;

DESCRIPTION OF EMBODIMENT

Next, some embodiments according to the present invention will be described referring to accompanying drawings. The present invention, however, is not restricted to those embodiments and has a scope defined in claims attached hereto and equivalents thereto including all modifications and changes. In the description of the drawings, numerals or symbols same with or similar to each other will refer to elements same with or similar to each other without duplicating explanations.

Figure 1:
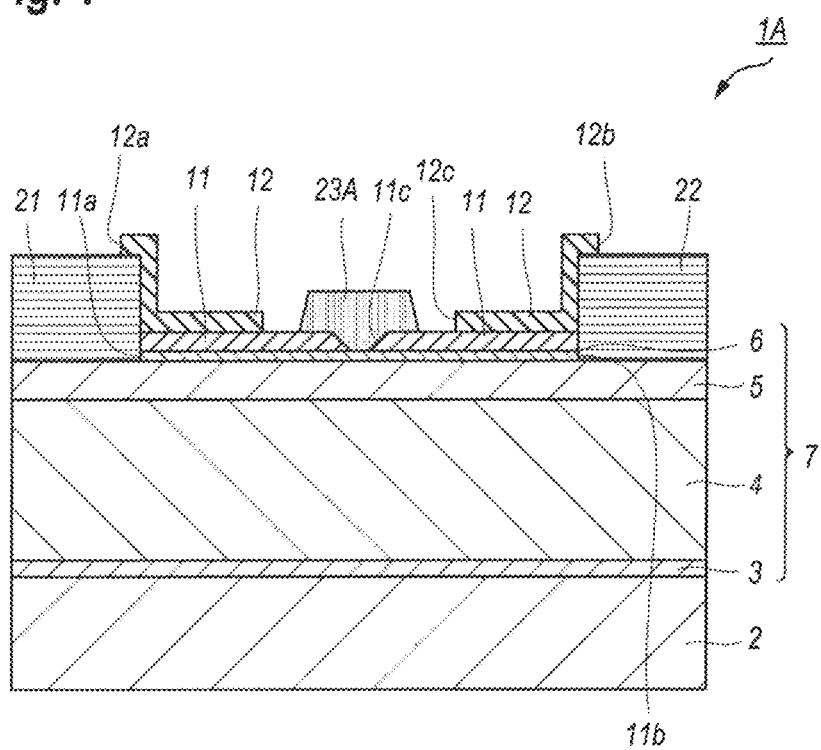
FIG. 1 is a cross sectional view of a field effect transistor (FET) formed by a process according to the first embodiment of the present invention.

FIG. 1 is a cross sectional view of a field effect transistor (FET) formed by a process according to the first embodiment of the invention. The FET 1A includes, as shown in FIG. 1, a substrate 2, a semiconductor stack 7, first and second insulating films, 11 and 12, and electrodes of a source 21, a drain 22, and a gate 23, where the first and second insulating films, 11 and 12, are made of silicon nitride (SiN), which will be hereinafter referred to SiN films. The semiconductor stack 7 includes, from the side of the substrate 2, a buffer layer 3, a channel layer 4, a barrier layer 5, and a cap layer 6. The FET 1A shown in FIG. 1 has a type of, what is called, high electron mobility transistor (HEMT) providing a two dimensional electron gas (2 DEG) at an interface between the channel layer 4 and the barrier layer 5, exactly, in the channel layer 4 at the interface against the barrier layer 5, where the 2 DEG becomes a channel of the transistor.

The substrate 2, which is provided for growing epitaxial layers thereon, is made of, for instance, silicon carbide (SiC), gallium nitride (GaN), silicon (Si), and/or sapphire ($Al_2O_3$). The present embodiment provides the substrate 2 made of SiC. The buffer layer 3, which is provided for creating nucleuses for epitaxially growing the channel layer 5 with good quality thereon, is made of, for instance, aluminum nitride (AlN). The buffer layer 3 has a thickness of 10 to 100 nm. The channel layer 4 may form, as described above, the 2 DEG at the interface against the barrier layer 5, and made of GaN with a thickness of 0.4 to 2.0 μm.

The barrier layer 5, which is epitaxially grown on the channel layer 4, may be made of semiconductor material having electron affinity greater than that of the channel layer 4. The barrier layer 5 may be made of n-type aluminum gallium nitride (AlGaN) with a thickness of 5 to 30 nm. The cap layer 6, which is epitaxially grown on the barrier layer 5, may be made of n-type GaN with a thickness at least 1 nm but thinner than 5 nm.

The first SiN film 11 protects a surface of the semiconductor stack 7 mechanically and chemically. The first SiN film 11 is formed by low pressure chemical vapor deposition (LPCVD) technique at relatively higher temperature compared with that for depositing the second SiN film 12. Accordingly, the first SiN film 11 becomes compact and dense compared with the second SiN film 12. Also, the first SiN film 11 preferably has silicon (Si) composition greater than that of stoichiometric composition, namely, Si-rich composition; and refractive index thereof greater than 2.05. The first SiN film has a thickness at least 20 nm but thinner than 50 nm; and provides openings, 11a to 11c, for the electrodes of the source 21, the drain 22, and the gate 23, respectively. The gate opening 11c exposes a surface of the cap layer 6 therein and has a shape gradually widened from the surface of the cap layer 6. That is, the gate opening 11c has a side making an obtuse angle against the surface of the cap layer 6 exposed therein. The source and drain openings, 11a and 11b, expose the barrier layer 5 removing the cap layer 6.

The electrodes of the source 21 and the drain 22 cover the source opening 11a and the drain opening 11b of the first SiN film 11 and are in direct contact with the barrier layer 5 removing the cap layer 6 therein. The source electrode 21 and the drain electrode 22, which show non-rectifier characteristic against the barrier layer 5, may be formed by allowing stacked metals of titanium (Ti) and aluminum (Al). Stacked metals may further stack another Ti on Al.

The gate electrode 23A is in direct contact with the cap layer 6 within the gate opening 11c of the first SiN film 11. The gate electrode 23A fully buries the gate opening 11c and partially covers the first SiN film 11 around the gate opening 11c. The gate electrode 23A may be made of stacked metals of nickel (Ni) and gold (Au) with thicknesses of 0.2 μm and 0.7 μm, respectively, where Ni makes a Schottky contact against the semiconductor stack 7. In an alternative, platinum (Pt) instead of Ni may form the Schottky contact against the semiconductor stack 7.

The second SiN film 12 may be formed by plasma assisted chemical vapor deposition (p-CVD) technique at a temperature lower than a deposition temperature of the first SiN film 11, which may form the second SiN film in relatively sparse and soft. The second SiN film 12 has the Si composition smaller than that of the first SiN film 11 and has refractive index around 1.8 or smaller. The second SiN film 12 may have a thickness at least 250 nm but thinner than 500 nm in the present embodiment. The second insulating film 12 provides source, drain, and gate openings, 12a to 12c, where the gate opening 12c fully exposes the gate opening 11c and the surface thereof around the opening 11c. The gate electrode 23A exists within the gate opening 12c so as to form a gap against an edge of the opening 12c of the second SiN film 12. The source and drain openings, 12a and 12b, expose the source and drain electrodes, 21 and 22, such that the second SiN film 12 partly cover the source and drain electrodes, 21 and 22. Interconnections for the source and drain electrodes, 21 and 22, which are not shown in the figures, may be electrically connected with the source and drain electrodes, 21 and 22, through the respective openings, 12a and 12b.

Next, a process of forming the FET 1A according to the first embodiment of the present invention will be described referring to FIG. 2A to FIG. 5B, where those figures are cross sectional views of the FET 1A at respective steps of the process. Also, FIG. 4A to FIG. 5B magnify a portion around the gate electrode 23A.

Figure 2A:
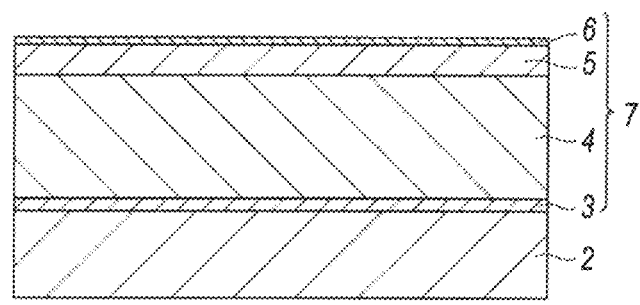
FIG. 2A and FIG. 2B are cross sectional views of the FET at respective steps of the process according to the first embodiment of the present invention.
Figure 2B:
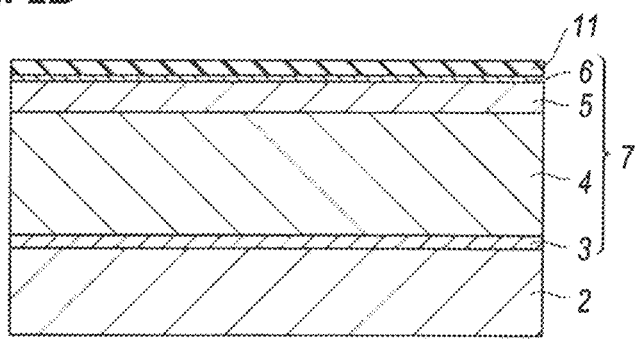

The process first forming the semiconductor stack 7 by growing an AlN layer, a GaN layer, an AlGaN layer, and another GaN layer on an SiC substrate sequentially and epitaxially by metal organic chemical vapor deposition (MOCVD) technique as shown in FIG. 2A, where those layers operate as the buffer layer 3, the channel layer 4, the barrier layer 5, and the cap layer 6, respectively. Then, the LPCVD technique deposits the first SiN film 11 on the semiconductor stack 7 by a thickness of 20 to 50 nm. The LPCVD technique uses di-chloro-silane ($SiH_2Cl_2$) and ammonia ($NH_3$) as source materials for Si and nitrogen (N) and a deposition temperature preferably enough higher than that of the p-CVD technique for the second SiN film 12 but comparable to or lower than a growth temperature of the semiconductor layers, 3 to 6, in the semiconductor stack 7 to prevent dissociation of atoms from the surface of the semiconductor stack 7. Specifically, the deposition temperature of the first SiN film 11 is preferably 800 to 900° C. Also, a deposition pressure is preferably 10 to 100 Pa, and a ratio of flow rates of $SiH_2Cl_2$ against $NH_3$ to be 0.05, which is greater than a ratio of the flow rates of the source materials for a SiN film with the stoichiometric composition. Specifically, the flow rate of $SiH_2C_2$ is preferably 10 to 100 sccm, while, that of $NH_3$ is preferably 0.5 to 2 slm, where the unit of sccm, or slm, means an amount a minute under standard pressure, and 1 sccm is equal to $1.69 \times 10^{-4}$ [Pa·m³/sec]. In the present embodiment, $SiH_2Cl_2$ and $NH_3$ flow by 50 sccm and 500 sccm, respectively, and the deposition pressure and temperature are set to be 50 Pa and 850° C., respectively.

Figure 3A:
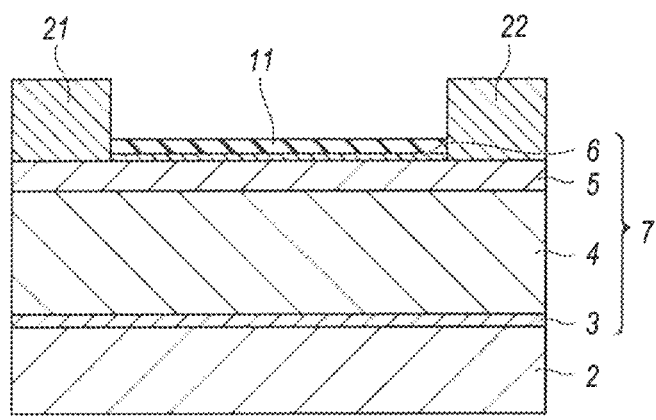
FIG. 3A and FIG. 3B are cross sectional views of the FET at respective steps of the process subsequent to the step shown in FIG. 2B.
Figure 3B:
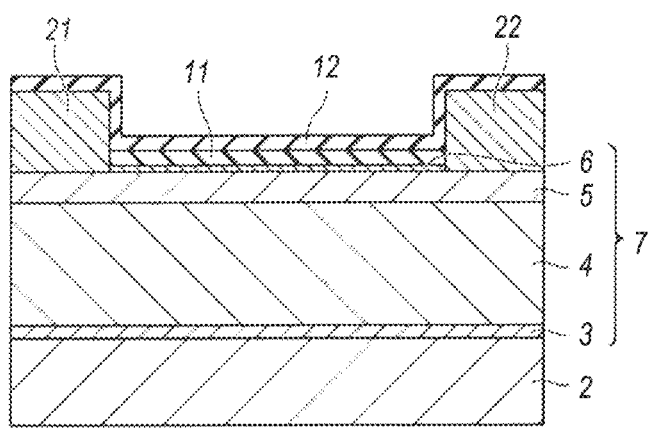

Thereafter, as shown in FIG. 3A, the process forms the source opening 11a and the drain opening 11b in the first SiN film 11. Selective etch using a patterned photoresist and a reactive gas containing fluorine (F) may form the source and drain openings, 11a and 11b. The process may further etch the cap layer 6 exposed within the openings, 11a and 11b, by another reactive gas containing chlorine (Cl) to expose the barrier layer 5 under the cap layer 6. A vacuum evaporation of titanium (Ti) and gold (Au) and subsequent lift-off technique may leave stacked metals of Ti/Al on the barrier layer 5 within the openings, 11a and 11b. Alloying the stacked metals may form the ohmic electrodes of the source 21 and the drain 22 within the openings, 11a and 11b.

Thereafter, the first SiN film 11 and the ohmic metals, 21 and 22, are fully covered with the second SiN film 12, where the second SiN film 12 may be formed by the p-CVD technique by a thickness of 250 to 500 nm in the present embodiment, as described above. The p-CVD technique uses conditions of the deposition temperature preferably lower than 350° C. and the deposition pressure of 50 to 200 Pa. Because the plasm generated by a radio frequency (RF) signal of 13.56 MHz assists ionization of the source materials, $SiH_4$ and $NH_3$, to form active elements of silicon (Si) and nitrogen (N); the p-CVD technique may lower the deposition temperature thereof. The flow rates of mono-silane ($SiH_4$) and ammonia ($NH_3$) are preferably to be 10 to 50 sccm and 100 to 500 sccm, respectively. The present embodiment sets the deposition conditions of the second SiN film 12 to be 20 and 200 sccm for the flow rates of $SiH_4$ and $NH_3$, the deposition pressure of 133 Pa, the deposition temperature of 350° C., and power of the RF signal for generating plasm to be 200 W. The second SiN film 12 deposited under those conditions may show the refractive index around 1.8.

Figure 4A:
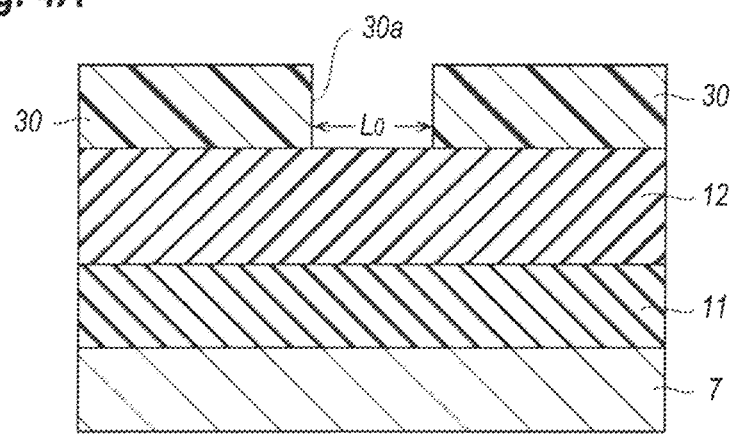
FIG. 4A and FIG. 4B are cross sectional views of the FET at respective steps of the process subsequent to the step shown in FIG. 3B, where FIG. 4A and FIG. 4B magnifies a portion around the gate electrode.
Figure 4B:
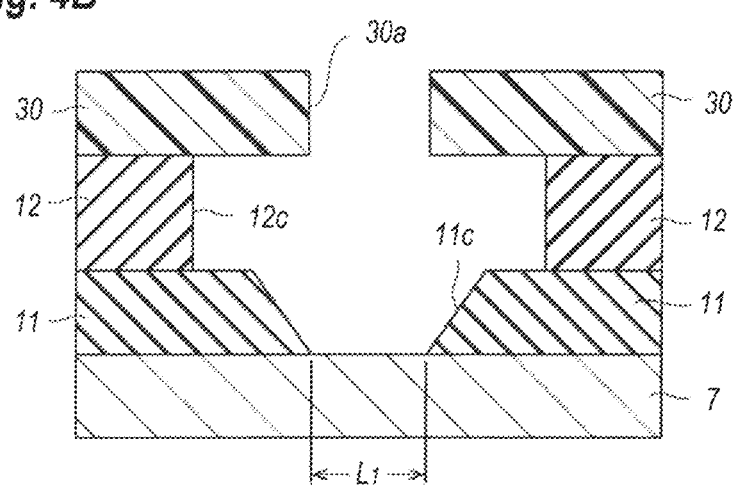

Thereafter, as shown in FIG. 4A, the process prepares a patterned photoresist 30 on the second SiN film 12, where the photoresist 30 is a type of ultraviolet exposure or electron beam (EB) photoresist and provides an opening 30a that overlaps with the gate opening 11c to be formed in the first SiN film 11. The opening 30a has a width $L_0$ of, for instance, 50 nm, along a direction connecting the source electrode 21 with the drain electrode 22 for an EB photoresist, or around 400 nm for an ultraviolet exposure photoresist. The width $L_0$ may be determined from a minimum width $L_1$ designed for the gate opening 11c in the first SiN film 11, which refers to FIG. 4B.

The process, thereafter, etches portions the second and first SiN films, 12 and 11, sequentially and continuously to expose the surface of the cap layer 6 by forming openings, 12c and 11c, respectively, using the patterned photoresist 30 as an etching mask. Because the first insulating film 11 is compact and dense compared with the second insulating film 12, substantial overhangs may be formed in the patterned photoresist 30 when conditions for etching the first SiN film 11 are applied for etching the second insulating film 12. That is, the second insulating film 12 in edges of the opening 12c thereof is retreated from the edge in the opening 30a of the photoresist 30. A dry-etching, such as reactive ion etching RIE and/or induction coupled plasma RIE (ICP-RIE) using reactive gas contain fluorine (F), such as sulfur hexa-fluoride ($SF_6$), tetra-fluoro-methane ($CF_4$), tri-fluoro-methane ($CHF_3$), hexa-fluoro-propene ($C_3F_6$), and/or hexa-fluoro-ethane ($C_2F_6$), may etch the second and first SiN films, 12 and 11. The etching pressure is around 1 Pa and the RF power of 100 W may be applicable to the etching. The etching pressure, not only the RF power, affects the anisotropy of the etching.

FIG. 6A to FIG. 6D schematically illustrate cross sections of the gate openings, 11c and 12c, depending on an aspect ratio of the etching rate for the first SiN film 11 and the that for the second SiN film 12. FIG. 6A corresponds to a status where the depth of the gate opening 12c in the second SiN film 12 becomes equal to a thickness of the second SiN film 12; that is, a status where the etching for the second SiN film 12 just reaches the first insulating film 11. FIG. 6B to FIG. 6D show statuses where the etching for the first SiN film 11 gradually advance from the status shown in FIG. 6A. In particular, FIG. 6D shows a status where the etching just reaches the surface of the cap layer 6. Broken squares $D_2$ shown in the figures schematically illustrate the aspect ratio $A_2$ ($=a_2/b_2$) of the etching rate for the second SiN film 12, while other broken squares $D_1$ corresponds to the aspect ratio $A_1$ ($=a_1/b_1$) of the etching rates for the first SiN film 11, where the echoing rates, $a_1$ and $a_2$, are those for the vertical direction, namely, along the thickness direction; while, the etching rates, $b_1$ and $b_2$, are those for the horizontal direction, namely, along the layer direction.

The second SiN film 12 of the embodiment, as described above, is formed by the p-CVD technique, while, the first SiN film 11 is formed by the LPCVD technique, which results in greater tolerance of the first SiN film 11 against a dry etching. Chemical reaction becomes dominant for the second SiN film 12, where the horizontal etching rate increases and finally becomes comparable to the vertical etching rate; while, physical reaction becomes dominant in the etching for the first SiN film 11, which results in a horizontal etching rate far smaller than that of a vertical etching rate.

That is, the vertical etching rate $a_1$ for the first SiN film 11 becomes smaller than that $a_2$ for the second SiN film 12, and the horizontal etching rage $b_1$ becomes smaller than that $b_2$ for the second SiN film 12. Moreover, the aspect ratio $A_1$ for the first SiN film 11 becomes greater than the aspect ratio $A_2$ for the second SiN film 12. One of examples of the etching rates and the aspect ratios are $a_1=4$ nm/min, $a_2=20$ nm/min, which results in a ratio $a_2/a_1$ around 5, $b_1=0.5$ nm/min and $b_2=8$ nm/min, which results in a ratio $b_2/b_1$ around 16. For those etching rates, a ratio $A_1/A_2$ for the two aspect ratios, $A_1$ and $A_2$, becomes 16/5. Varying the etching conditions, this ratio $A_1/A_2$ may become greater than 16/5.

As shown in FIG. 6A to FIG. 6D, the second SiN film 12 may be etched during the etching for the first SiN film 11, which may retreat edges of the opening 12c in the second SiN film 12 and the surface of the first SiN film 11 around the opening 11c thereof gradually exposes. Two cases are assumed. The first case is that the etching for the first SiN film 11 precisely traces the edge 30a of the patterned photoresist 30; that is, the reaction gas is only provided for an area exposed from the opening 30a, the surface of the first SiN film 11 beneath the beneath the photoresist 30 is not etched and only the side etch for the second SiN film 12 advances. Under such a condition, the opening 11c in the first SiN film 11 may have a side Wa shown in FIG. 6D with an angle θ against the surface of the semiconductor stack 7 only following the aspect ratio A1 in the etching rates for the first SiN film 11. However, most cases in the etching for the first SiN film 11 may etch the surface thereof beneath the overhang in the patterned photoresist 30, which may retreat the edge of the opening 11c in the first SiN film 11, in particular, the edge of the opening 11c at the top surface thereof retreats from the original edge. A slope Wb shown in FIG. 6B to FIG. 6D correspond to another extremum case where the surface of the first SiN film 11 beneath the overhang in the patterned photoresist 30 is enough etched during the etching of the first SiN film 11. In such a case, the side Wb extends from an end of the opening 12c in the second SiN film 12 to the end of the opening 11c in the first SiN film 11. The edge of the opening 11c in the first opening 11 practically becomes Wc between the two extrema cases described above. Accordingly, the angle θ of the side Wc of the gate opening 11c in the first SiN film 11 becomes:

$$\tan^{-1}(a_1/b_1) > \theta > \tan^{-1}\{t_1/(b_2*(t_1/a_1))\},$$

$$\tan^{-1}(8) > \theta > \tan^{-1}(0.5),$$

where $t_1$ is a thickness of the first SiN film 11.

The second SiN film 12 retreats by an amount B measured from the bottom of the gate opening 11c in the first SiN film 11, which becomes greater as the thickness $t_1$ of the first SiN film 11 increases. In an example, the retreat B becomes 0.15 μm for thicknesses, $t_1$ and $t_2$, of the first and second SiN films, 11 and 12, to be 20 and 250 nm, respectively, and the slope θ becomes 50°. In another example where the thicknesses, $t_1$ and $t_2$, are set to be 20 and 120 nm, respectively, the retreat B becomes 0.1 μm and the slope θ is 70°. The slope θ becomes smaller as the thickness $t_2$ of the second SiN film 12 thicker; however, the second SiN film 12 with a thickness $t_2$ thereof exceeds 300 nm, the slope in an angle θ against the surface of the semiconductor stack 7 saturates around 50° because the first SiN film 11 in the side of the opening 11c is also etched.

Also, an increase in the pressure during the etching may make the angle θ of the side in the gate opening 11c smaller because a mean free path of reactive ions between collisions becomes suppressed as the etching pressure increases, which also makes the advancing directions thereof isotropic. A thickened second SiN film 12 also saturates the angle θ around 45°. The saturated angle θ becomes smaller as the pressure becomes higher.

Figure 5A:
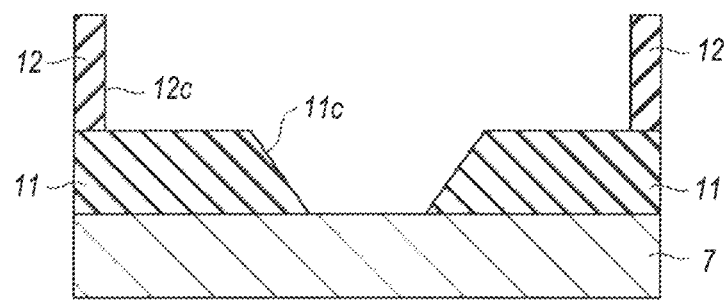
FIG. 5A and FIG. 5B are cross sectional views of the FET around the gate electrode at respective steps of the process subsequent to the step shown in FIG. 4B.
Figure 5B:
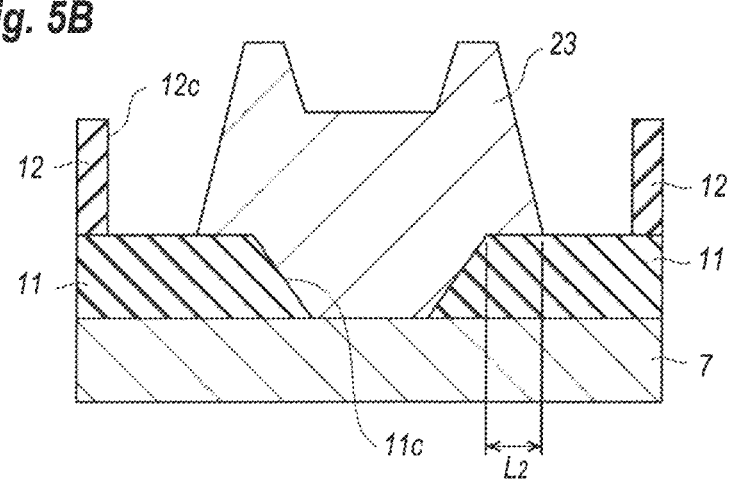

Referring to FIG. 5A, the process thereafter removes the patterned photoresist 30 and deposits a gate electrode 23A on the semiconductor stack 7 exposed in the gate opening 11c in the first SiN film 11 and the first SiN film 11 in a portion around the gate opening 11c as shown in FIG. 5B. Specifically, removing the patterned photoresist 30o and re-forming another patterned photoresist that provides an opening fully exposing the gate opening 11c in the first SiN film 11 but partially covers the gate opening 12c in the second SiN film 12, the process sequentially deposits Ni and Au by the vacuum evaporation within the opening provided in the another photoresist. Residual metals deposited on the patterned photoresist may be removed accompanying with the removal of the patterned photoresist, which is often called as the lift-off technique. Thus, the gate electrode 23A that stacks Ni and Au is formed within the gate openings, 11c and 12c. As shown in FIG. 5B, the gate electrode 23A may fully covers the inclined side of the gate opening 11c but leave a gap against the second SiN film 12. However, when the opening prepared in the other patterned photoresist fully exposes the gate opening 12c in the second SiN film 12, the gate electrode 23A may partially covers the second SiN film 12 without leaving any gap therebetween.

Second Embodiment

Figure 8:
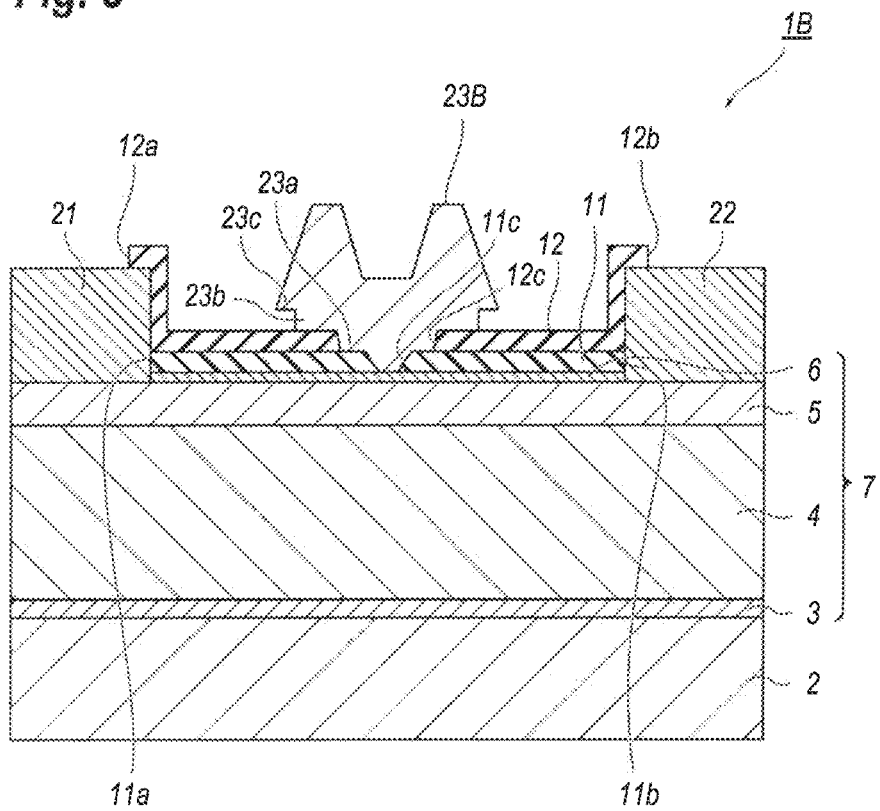
FIG. 8 is a cross sectional view of an FET formed by another process according to the second embodiment of the present invention.

FIG. 8 is a cross sectional view of another FET 1B formed by a process according to the second embodiment of the present invention. The process of the second embodiment fully traces the steps of forming the semiconductor stack 7 and depositing the first SiN film 11, but arranges the step of depositing the second SiN film 12. The second SiN film 12 of the second 3o embodiment is also provided on the first SiN film 11 and formed by the p-CVD technique to obtaining sparse characteristic thereof compared with the first SiN film 11. The second SiN film 12 preferably has the refractive index around 2.0 or smaller but has a feature that a thickness thereof is at least 30 nm but 500 nm at most. The second SiN film 12 of the present embodiment has the thickness of 40±5 nm.

The gate electrode 23B of the present embodiment fully fills the gate openings, 11c and 12c, in the first and second SiN films, 11 and 12, so as to be in contact with the surface of the cap layer 6 exposed within the gate openings, 11c and 12c, and partly overlaps with the first SiN film 11 around the gate opening 11c thereof and also partly overlaps with the second SiN film 12 around the gate opening 12c. The gate electrode 23B also includes Ni and Au layers, where the Ni layer is in contact with the cap layer 6 that forms the Schottky contact thereto. The Ni and Au layers have respective thickness of preferably 200 nm and 700 nm. In an alternative, platinum (Pt) may be used as the Schottky metal to be in contact with the cap layer 6 substituting from the Ni layer.

The gate electrode 23B in portions thereof overlapping with the first SiN film 11 and the second SiN film 12 may show a function to moderate the field strength concentrated at an edge of the gate electrode 23B. The former portion overlapping with the first SiN film 11 will be referred to a first portion 23a, while, the latter portion overlapping with the second SiN film 12 will be hereinafter referred to a second portion 23b. The first portion 23a has a width that may be determined by the width of the gate opening 12c in the second SiN film 12, while, the width of the second portion 23b may be determined by a width formed in the patterned photoresist, which will be described later. The gate electrode 23B of the present embodiment may further provide a third portion 23c extending outwardly from the second portion 23b, where the third portion 23c secures a gap against the second SiN film 12, which may moderate the function to reduce the field strength compared with the function attributed to the second portion 23b.

Next, a process of forming the FET 1B shown in FIG. 8 will be described referring to FIG. 9A to FIG. 10B, where those figures magnify a portion where the gate electrode 23B is to be formed at respective steps of the process of forming the FET 1B. The process may carry out steps same with those shown in FIG. 2A top FIG. 5A in the first embodiment.

Figure 9A:
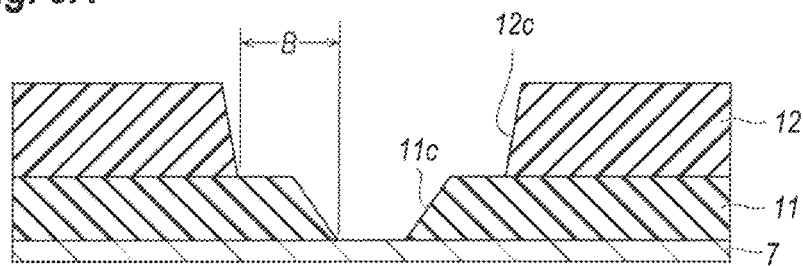
FIG. 9A and FIG. 9B are cross sectional views of the FET around the gate electrode at respective steps of the process subsequent to the step shown in FIG. 5A.

Referring to FIG. 9A, similar to the first embodiment, the second SiN film 12 in the edge of the gate opening 12c retreats from the lower edge of the gate opening 11c in the first SiN film 11 so as to expose the top surface of the first SiN film 11 partially, and an amount B of backing off, refer to FIG. 6D, increases as the thickness of the second SiN film 12 increases. In an example additionally to the example already explained, when the first SiN film 11 has a thickness of 20 nm and the second SiN film 12 has a thickness of 40 nm, the second SiN Film 12 retreats by 70 nm from the lower edge of the first SiN film 11 and shows an inclined angle θ of 75°. Thus, the inclined angle θ becomes smaller as the second SiN film 12 increases the thickness thereof; however, the second SiN film 12 with a thickness 300 nm or more, the inclined angle θ saturates around 50° to 60° because the first SiN film 11 in the side of the opening 11c is also etched.

Figure 9B:
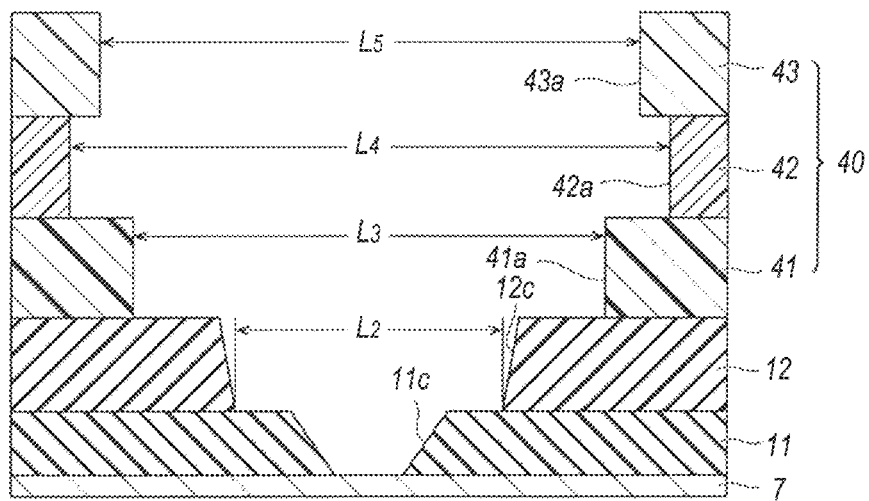

Removing the patterned photoresist 31 for forming the openings, 11c and 12c, the process of the second embodiment prepares another photoresist mask 40 on the second SiN film 12, where the photoresist mask includes a lower photoresist 41, an intermediate photoresist 42, and an upper photoresist 43, as shown in FIG. 9B. The lower photoresist 41 provides an opening 41a with a width $L_3$ greater than a width $L_2$ of the gate opening 12c in the second SiN film 12. The intermediate photoresist 42 provides an opening 42a with a width $L_4$ greater than the width $L_3$ of the opening 41a in the lower photoresist 41, and the upper photoresist 43 provides an opening 43a with a width $L_5$ that is greater than the width $L_3$ of the opening 41a in the lower photoresist 41 but smaller than the width $L_4$ of the opening 42a in the intermediate photoresist 42. That is, the upper photoresist 43 forms an overhang with respect to the intermediate photoresist 42.

The process sequentially spin-coats the tri-layered photoresists, 41 to 43, where the lower photoresist 41 may be a copolymer of α-chloro-acrylate and α-methyl-styrene, such as ZEP520A™ or ZEP520A-7™, where the copolymer above described may be diluted with anisole to modify viscosity thereof. The lower photoresist 41 preferably has a thickness of 50 to 400 nm, where the lower limit thereof is requested from a stable spin coat. The intermediate photoresist 42 may be poly-methyl-glutar-imide (PMGI) with a thickness of 300 to 800 nm, where the lower limit thereof is restricted by the thickness of the gate electrode 23B. The upper photoresist 43 is also ZEP520A™ or ZEP520A-7™ same with the lower photoresist 41 with a thickness of 100 to 400 nm, where the lower limit thereof is determined by process stability. The upper photoresist 43 is to be suffered to a heat process during the deposition of the gate electrode 23B, such as the vacuum evaporation, and the upper photoresist 43 is necessary to be stable for such heat process, that is, not to vary the width of the third portion 23c of the gate electrode 23B.

The process thereafter forms the openings, 41a to 43a, in the respective photoresists, 41 to 43. First, the electron beam (EB) exposure is carried out for the upper photoresist 43 in a portion thereof overlapping with the gate openings, 11c and 12c. Developing the upper photoresist 43, only the portion exposed to the electron beams may be removed to form the opening 43a with the width $L_5$ in the upper photoresist 43. During the formation of the opening 43a in the upper photoresist 43, the intermediate photoresist 42 and the lower photoresist 41 are left unchanged, because, the intermediate photoresist 42 is unable to change intrinsic characteristics thereof by the electron beams, while, the lower photoresist 14 becomes free from the electron beams by interposing the intermediate photoresist 42. That is, the electron beams enough penetrate into the upper photoresist 43 but substantially stopped within the intermediate photoresist 42. Immersing the intermediate photoresist 42 within an alkali solution through the opening 43a; the intermediate photoresist 42 forms the opening 42a as causing the side-etching under the overhang of the upper photoresist 43. That is, the intermediate photoresist 42 is soluble for an alkali solution but the lower and upper photoresists, 41 and 43, are insoluble. Thus, the opening 42a with the width greater than the width of the opening 43a in the upper photoresist 43 may be formed in the intermediate photoresist 42.

Thereafter, the EB exposure in a portion fully overlapping with the openings, 11c and 12c, is carried out for the lower photoresist 41 exposed within the openings, 42a and 43a, then the development of the lower photoresist 41 may form the opening 41a with the width $L_3$ smaller than the widths, $L_4$ and $L_5$, but greater than the width $L_2$ in the opening 12c of the second SiN film 12. Because the EB exposure forms the openings, 41a and 43a; the widths, $L_3$ and $L_5$, attributed thereto may be precisely formed compared with the opening 42a in the intermediate photoresist 42, which means that the width $L_2$ in the opening 41a may be precisely formed, where the width $L_3$ determines the extruding amount of the second portion 23b of the gate electrode 23B and this portion causes the function to moderate the field strength of the channel of the FET 1B.

Figure 10A:
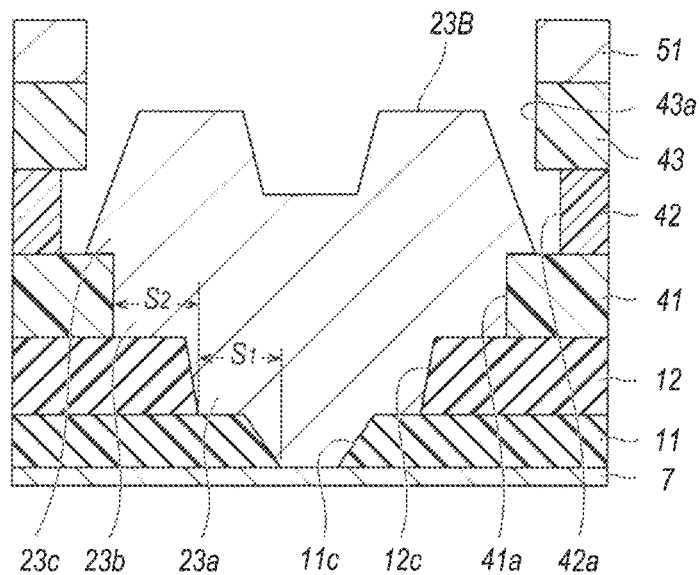
FIG. 10A and FIG. 10B are cross sectional views of the FET around the gate electrode at respective steps of the process subsequent to the step shown in FIG. 9B.
Figure 10B:
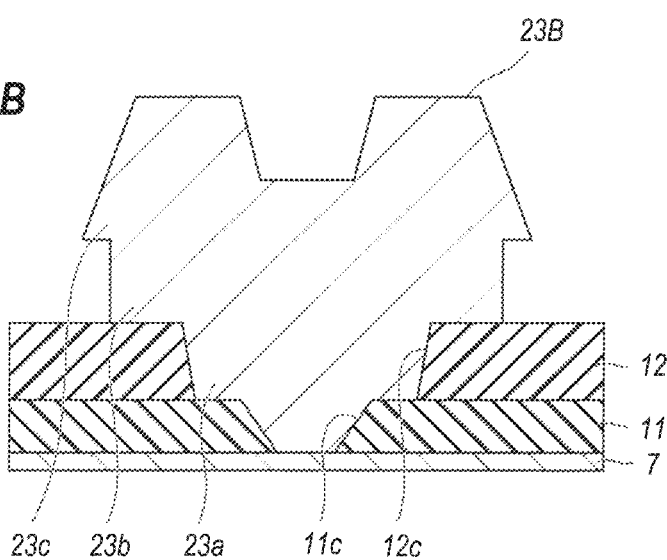

Thereafter, the process deposits metals of Ni and Au for the gate electrode 23B using the tri-layered photoresists, 41 to 43, as a deposition mask, as shown in FIG. 10A, where the gate electrode 23B is in contact with the cap layer 6 exposed in the gate opening 11c and partly covers the first SiN film 11 around the gate opening 11c by the first portion 23a thereof, partly covers the second SiN film 12 around the opening 12a thereof by the portion 23b, and partly covers the lower photoresist 41 by the third portion 23c thereof. The gate electrode 23B has a thickness of 200 nm in Ni and 700 nm in Au, which is same with the arrangement of the gate metal 23A of the first embodiment. The first portion 23a has the width $S_1$, while, the second portion 23b has the width $S_2$. Removing the tri-layered photoresists, 41 to 43, with residual metals 51 accumulated on the upper photoresist 43 may be removed as the removal of the tri-layered photoresists, 41 to 43, which may be called as the lift-off technique, as shown in FIG. 10B. Thus, the process of forming the FET 1B according to the present embodiment is completed.

Third Embodiment

Figure 11:
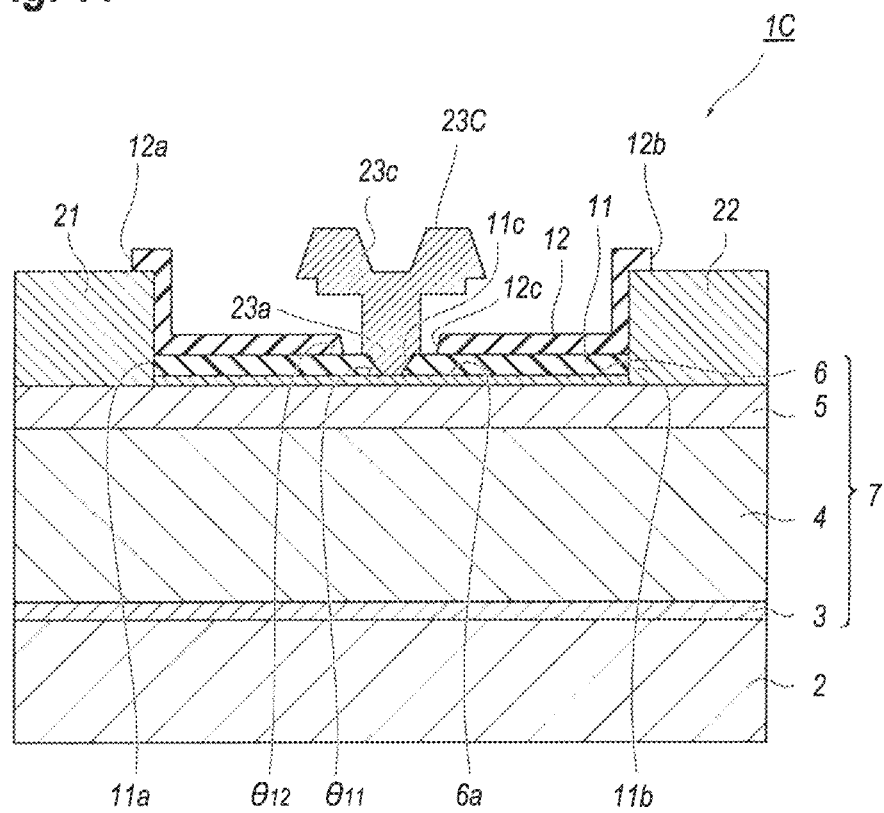
FIG. 11 is a cross sectional view of an FET formed by still another process according to the third embodiment of the present invention.

FIG. 11 is a cross sectional view of an FET 1C according to the third embodiment of the present invention. The FET 1C shown in FIG. 11 has features distinguishable from the arrangements of the FETs, 1A and 1B, of the aforementioned embodiment that the gate electrode 23C is also in contact with the top of the semiconductor stack 7, namely the cap layer 6 through the gate opening 11c in the first SiN film 11 but provides first and third portions, 23a and 23c, where the first portion 23a provides a pentagonal cross section and in contact with the cap layer 6 and rides on the first SiN film 11 that is exposed within the opening 12c in the second SiN film 12. The third portion 23c of the gate electrode 23C in the bottom surface thereof has steps, where the third portion 23c is apart from the second SiN film 12. The gate electrode 23C of the present embodiment provides no second portion 23b partly covering the second SiN film 12, which appears in the aforementioned embodiment. That is, the third portion 23c forms a gap against the second SiN film 12. The second SiN film 12 is apart from the gate electrode 23C similar to the arrangement in the FET 1A of the first embodiment shown in FIG. 1.

The FET 1C according to the third embodiment shown in FIG. 11 has same arrangements with those of the FET 1A shown in FIG. 1 from the substrate 2 to the first SiN film 11 and the electrodes of the source 21 and the drain 22 in respective materials and thicknesses; but has structures in the second SiN film 12 and the gate electrode 23C. That is, the SiN film 12 of the third embodiment, which is also formed by the p-CVD technique, has refractive index around 2.0 or smaller and a thickness of 40 to 200 nm. The second SiN film 12 also provides the gate opening 12c with a width of 100 to 600 nm, which is wider than the width of the gate opening 11c in the first SiN film 11, namely, 50 to 600 nm. The edges of the gate opening 12c in the second SiN film 12 preferably have an angle against the surface of the first SiN film 11, which is greater than an angle of the edge of the gate opening 11c of the first SiN film 11, which is 45 to 75° against the surface of the cap layer 6.

Next, a process of forming the FET 1C will be described referring to FIG. 12A to FIG. 15 that show cross sectional views of the FET 1C around the gate electrode 23C at respective steps of the process.

The process first forms the semiconductor stack 7 according to procedures same with those of the aforementioned steps; then deposits the first SiN film 11 by the LPCVD technique whose conditions are also same with those of the aforementioned embodiment. Electrodes of the source 21 and the drain 22 are then formed onto the barrier layer 5 by forming the openings, 11a and 11b, in the first SiN film 11, removing the cap layer 6 exposed in the openings, 11a and 11b, depositing stacked metals of Ti and Al, and alloying the deposited metals. After the formation of the electrodes, 21 and 22, the whole surface is covered with the second SiN film 12 with a thickness around 40 nm and refractive index around 1.8.

Figure 12A:
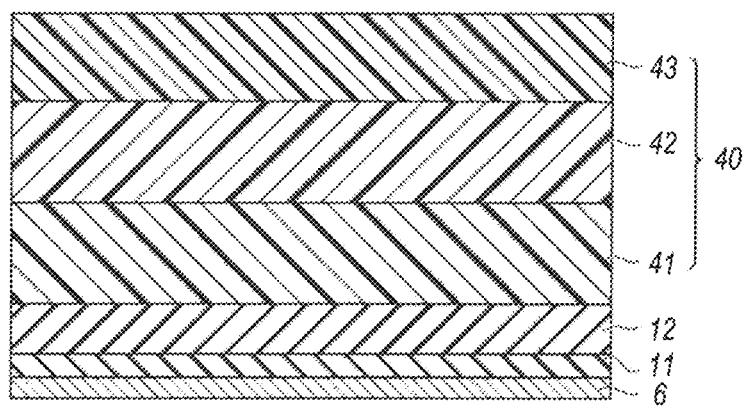
FIG. 12A and FIG. 12B are cross sectional views of the FET around the gate electrode at respective steps of the process subsequent to the step shown in FIG. 2B.

Then the process prepares the photoresist mask 40 on the second SiN film 12A as shown in FIG. 12A. The photoresist mask 40 includes the lower photoresist 41 on the second SiN film 12, the intermediate photoresist 42 on the lower one 41, and the upper photoresist 43 on the intermediate one 42. Each of the photoresists, 41 to 43, has a thickness of 150 to 800 nm; specifically, 400, 400, and 400 nm respectively.

The photoresists, 41 to 43, are types of electron beam (EB) photoresist; for instance, the lower and upper photoresists, 41 and 43, are a type of copolymer of -chloro-acrylate and α-methyl-styrene, where an example of such a material is ZEP520A™; while, the intermediate photoresist 42 is a type of poly-methyl-glutar-imide (PMGI) soluble for an alkali solution, where the arrangements of the tri-layered photoresists, 41 to 43, are substantially same with those described in the second embodiment shown in FIG. 9B.

Thereafter, the process forms an opening 40a in the tri-layered photoresist 40; specifically, an irradiation of electron beams to the upper photoresist 43 by a width $W_1$ with subsequent development forms an opening 43a in the upper photoresist 43. Conditions of the EB exposure, in particular, the dosage and the acceleration voltage of the beams and the thickness of the intermediate photoresist 42, may be determined such that the lower photoresist 41 substantially becomes free from the electron beams. The width $W_1$ of the opening 43a corresponds to a width of the horizontal bar of the T-character of the gate electrode 23C, namely, the width of the third portion 23c. The EB exposure may precisely determine the width $W_1$ of the opening 43a. The present embodiment sets the dosage of the beam to be 60 μC/cm² and the width of the opening 43a to be 500 nm. The development of the upper photoresist 43 may be carried out by a solution containing at least one of methyl isobutyl ketone (MIBK) and methyl ethyl ketone (MEK). The embodiment uses a solution with a ratio of MIBK against MEK (MIBK/MEK) greater than 6/4.

Thereafter, the process forms the opening 42a in the intermediate photoresist 42. Specifically, immersing the intermediate photoresist 42 within an alkali solution through the upper photoresist 41, for instance, a solution of tetra-methyl-ammonium hydro-oxide (TMAH), the process may form the opening 42a with a width greater than the width $W_1$ in the upper photoresist 43; that is, the upper photoresist 43 forms overhangs against the intermediate photoresist 42.

Thereafter, the process forms the opening 41a in the lower photoresist 41 exposed within the openings, 43a and 42a. Specifically, an exposure of the lower photoresist 41 by the beams accompanying with a subsequent development may form the opening 41a with a width $W_2$ that exposes the second SiN film 12 therein. The dosage of the EB exposure for the lower photoresist 41 is set to be greater than that for the upper photoresist 43, which may securely expose the second SiN film 12 by the width $W_2$. The present embodiment sets the dosage to be 800 μC/cm² and the width $W_2$ to be 70 nm. During the exposure for the lower photoresist 41, the intermediate and upper photoresists, 42 and 43, may be securely free from the electron beams. Also, the developer for forming the opening 41a in the lower photoresist 41 may be thinner than the developer for the upper photoresist 43, which may effectively suppress for the opening 43a in the upper photoresist 43 to be further widened. The embodiment uses a mixture of MIBK and isopropyl alcohol (IPA).

Figure 12B:
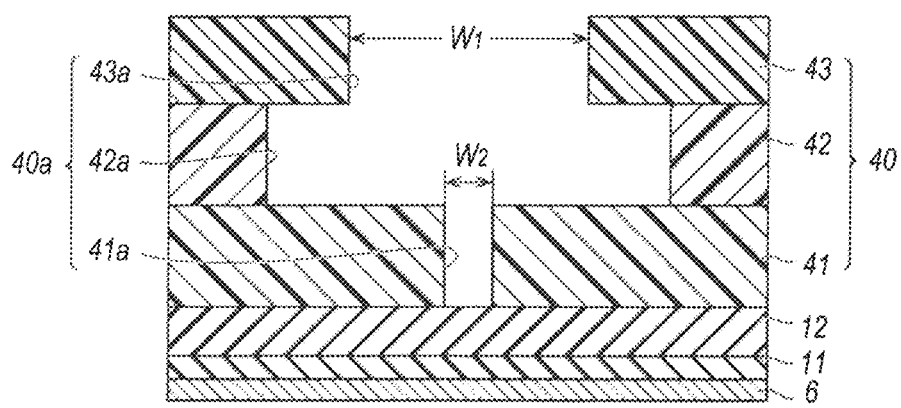

Thus, the process may prepare the photoresist mask 40 with the openings, 41a to 43a, in the respective photoresists, 41 to 43, where the openings, 41a to 43a, are overlapped each other, the widest in the opening 42a, and the width $W_1$ of the opening 43a in the upper photoresist 43 that is wider than the width $W_2$ of the opening 41a in the lower photoresist 41, which is shown in FIG. 12B.

Thereafter, a dry-etching of the films, 12 and 11, selectively may form an opening O in the second and first SiN films, 12 and 11. Specifically, using the photoresist mask 40 as an etching mask, the continuous dry-etching without adjusting conditions thereof may form the opening 12c in the second SiN film 12 and the opening 11c in the first SiN film 11. The opening O exposes the cap layer 6 by a width substantially equal to the width $W_2$ of the opening 41a in the lower photoresist 41. Because the second SiN film 12 is formed by the p-CVD technique while the first SiN film 11 is formed by the LPCVD technique, the dry etching may cause substantial side etchings in the second SiN film 12. That is, the opening 12c in the second SiN film 12 becomes wider than the opening 11c in the first SiN film 11.

Figure 13A:
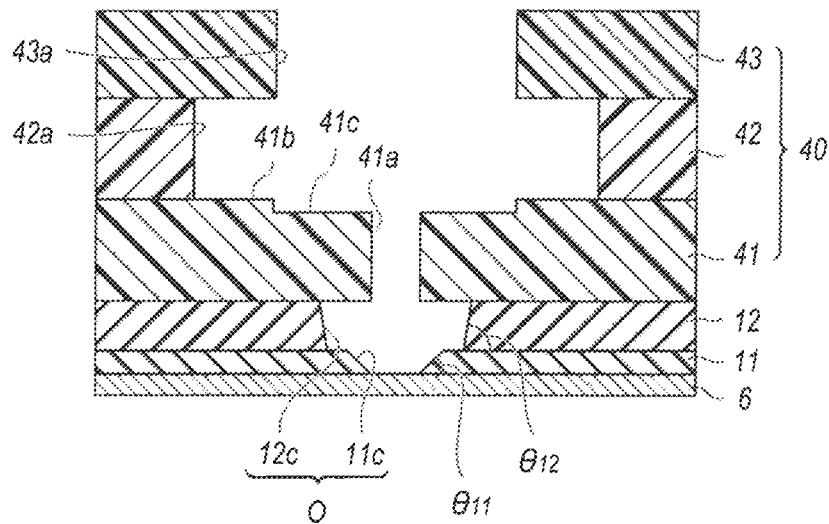
FIG. 13A and FIG. 13B are cross sectional views of the FET around the gate electrode at respective steps of the process subsequent to the step shown in FIG. 12B.

The dry etching done by the present step is, for instance, a reactive ion etching (RIE) using a reactive gas containing fluorine (F), such as, sulfur hexa-fluoride ($SF_6$), tetra-fluoro-methane ($CF_4$), tri-fluoro-methane ($CHF_3$), hexa-fluoro-propene ($C_3F_6$), and/or hexa-fluoro-ethane ($C_2F_6$) may form the opening O. Other conditions of the RIE technique are, when the reactive gas is $SF_6$, etching pressure of 2.0 Pa and RF power of 100 W, where both conditions of the etching pressure and the RF power may determine the side etching in the second SiN film 12. Also, the RIE technique may slightly etch the lower photoresist 41 exposed in the opening 41a of lower photoresist 41 to form a step 41c in the top surface 41b thereof as shown in FIG. 13A.

Figure 13B:
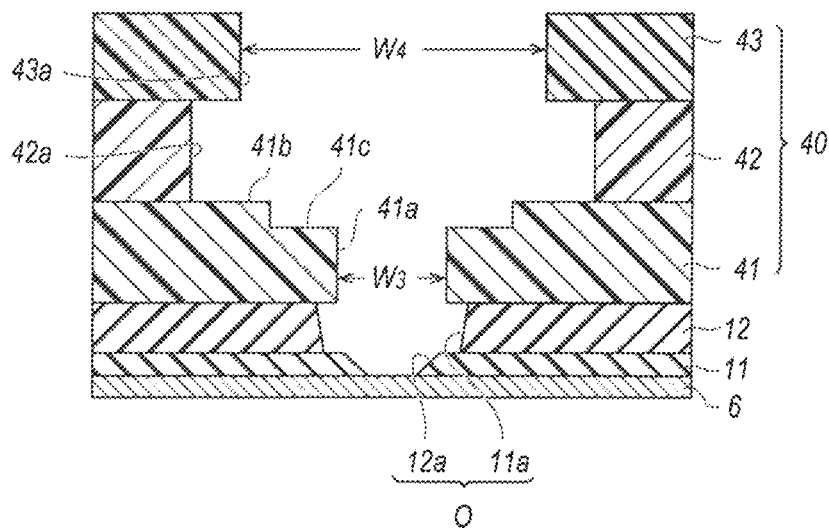

Thereafter, the process widens the opening 41a in the lower photoresist 41 as shown in FIG. 13B by immersing the photoresist mask 40 in the developer containing at least one of MIBK and MEK. The RIE technique to form the opening O in the first and second SiN films, 11 and 12, also irradiates the lower photoresist 41 exposed in the opening 4o and the top of the upper photoresist 43, which converts quality thereof. The developer may remove or etch those converted photoresist to expand the step 41c and to widen the opening 41a in the lower photoresist 41 to a width $W_3$ and the opening 43a in the upper photoresist 43 to a width $W_4$. Also, the upper photoresist 43 is slightly thinned. The width $W_3$ may be wider or smaller than a width of the opening 12c. When the original width $W_2$ of the opening 41a in the lower photoresist 41 to be too nm; the widened width $W_3$ thereof is preferably 140 to 400 nm.

As an example of the present step, a solution with a ratio of MIBK against IPA, MIBK/IPA, to be equal to 89/11 may widen the opening 41a by about 40 nm in one side thereof by immersing the photoresist mask 40 for go seconds. Another solution with a greater ratio of MIBK against IPA, and/or prolonged period of the immersion may further widen the opening 41a. Still another solution containing MEK instead of MIBK may show a similar retreat of the lower photoresist 41.

Figure 14A:
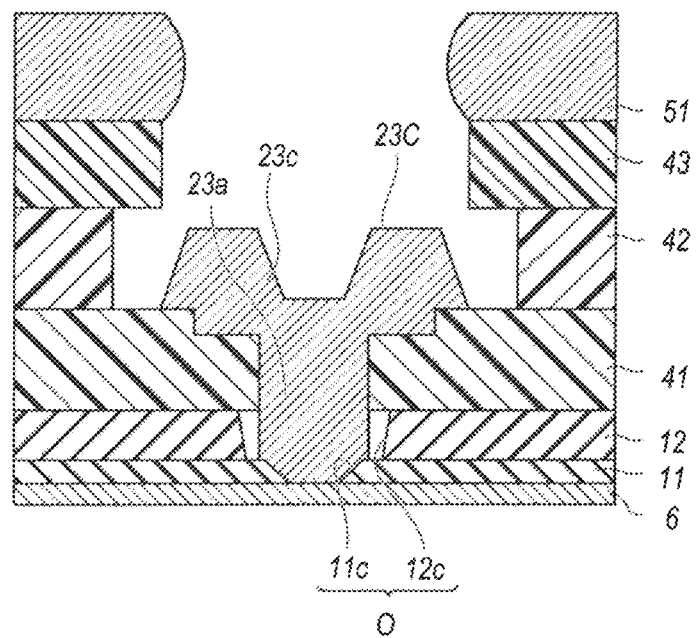
FIG. 14A and FIG. 14B are cross sectional views of the FET around the gate electrode at respective steps of the process subsequent to the step shown in FIG. 13B.

Thereafter, as shown in FIG. 14A, the process stacks metals of Ni and Au within the opening O and the opening 40 such that Ni is in contact with the cap layer 6 to form the Schottky contact thereto. Because the opening 41a in the lower photoresist 41 is widened during the previous step, the gate metals, Ni and Au, may be deposited on the step 41c and on the first SiN film 11 and the lower photoresist 41. The step 41c has a width substantially determined by the width W1 in the opening 43a before the process of second immersion within the developer.

Figure 14B:
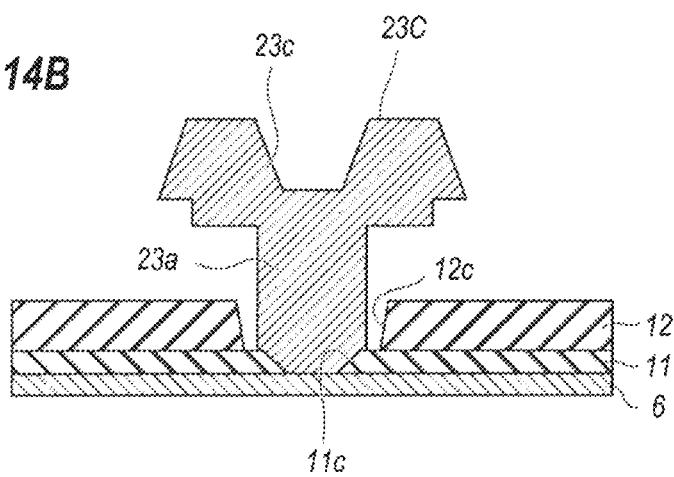

Thereafter, removing the photoresist mask 40 accompanying with residual metals 51 deposited thereon, the gate electrode 23C with a cross section of the T-character may be formed as shown in FIG. 14B. Thus, the process of forming the FET 1C shown in FIG. 11 may be completed. The FET 1C in the whole surface thereof including the electrodes of the source 21, the drain 22, and the gate 23C, and the second SiN film 12 between the electrodes, 21 or 23C, may be covered with still another insulating film, which may be a passivation film such as SiN formed by the p-CVD technique and/or aluminum oxide ($Al_2O_3$) formed by atomic Layer Deposition (ALD) technique. The third embodiment described above concentrates a condition where the widened opening 41a in the lower photoresist 41 after the second immersion within the developer has the width $W_3$ narrower than a width of the opening 12a in the second SiN film 12. However, the width $W_3$ of the widened opening 41a may be greater than the width of the opening 12c. Even in such an arrangement, the gate electrode 23C may be reliably formed by the steps described above and the cross section thereof becomes those of the FET 1B of the second embodiment. That is, the second portion 23b of the gate electrode 23C, which may be created by the arrangement described above, may be in contact with the edge of the second SiN film 12 but the third portion 23c thereof forms a gap against the second SiN film 12.

Next, advantages of the FETs, 1A to 1C, and the processes according to the present invention will be described. The FETs, A to 1C, provide two SiN films, 11 and 12, around the gate electrodes, 23A to 23C, where the first SiN film 11 is formed by the LPCVD technique at a relatively higher temperature, while, the second SiN film 12 is formed by the p-CVD technique at a relatively lower temperature. Accordingly, the first SiN film 11 becomes compact and dense compared with the second SiN film 12, which results in a greater etching rate for the second SiN film 12 when etching conditions for the respective films, 11 and 12, are set to be equal. That is, the second SiN film 12 in an edge of the opening 12a thereof may retreat during the formation of the opening 11c in the first SiN film 11 and partially exposes a top surface thereof as shown in FIG. 6A to FIG. 6D. Because the exposed top surface of the first SiN film 11 is gradually etched during the formation of the opening 11c, the edge of the opening 11c causes an angle against the surface of the cap layer 6 that is smaller than an angle determined by an aspect ratio of the etching rate for the first SiN film 11. Accordingly, the gate electrodes, 23A to 23C, of the present invention that have the cross sections thereof in the first SiN film 11 enough inclined against the cap layer 6 may suppress the reduction of the breakdown voltage of the gate electrode and the drain current collapsing due to the concentration of the electric filed into the edge thereof.

The LPCVD process may be carried out at conditions of a deposition temperature of 800 to 900° C., a deposition pressure of 50 to 100 Pa, source materials of di-chloro-silane ($SiH_2Cl_2$) and ammonia ($NH_3$) with a ratio of respective flow rates ($F_1/F_2$) greater than 0.1, where $F_1$ and $F_2$ are flow rates of $SiH_2Cl_2$ and ammonia $NH_3$, respectively. The first SiN film 11 thus deposited may be a Si-rich composition from the stoichiometric composition with refractive index thereof greater than 2.05. While, the second SiN film 12 may be formed by the p-CVD technique at a temperature of 300 to 350° C. The second SiN film 12 may show the refractive index of 2.0 or smaller.

Figure 7:
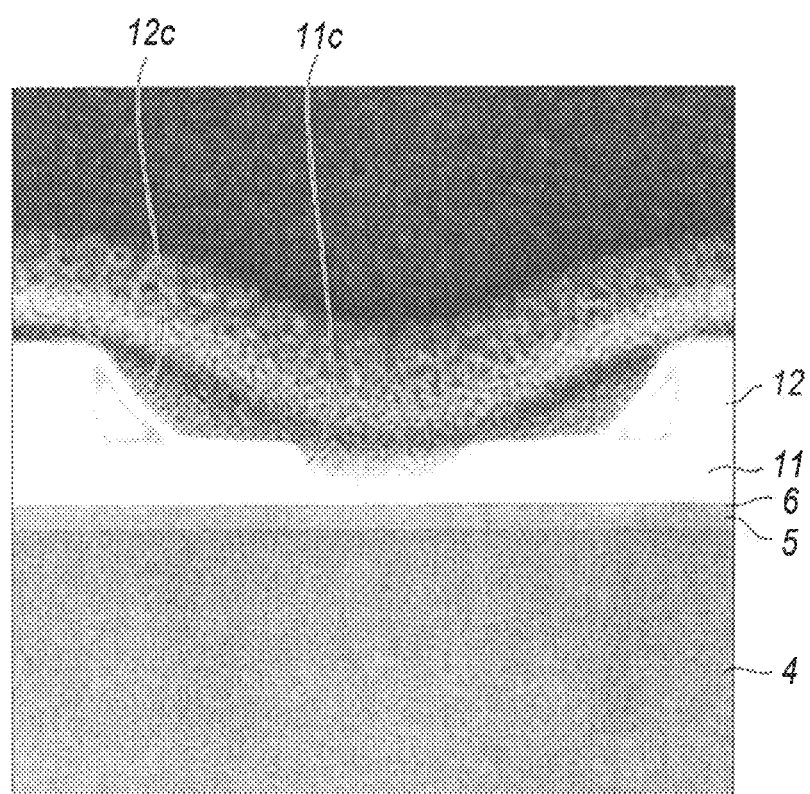
FIG. 7 is a photograph around the gate electrode taken by the scanning electron microscope (SEM)

Moreover, the process according to the invention continuously etches the second and first SiN films, 12 and 11, which leaves no residuals, such as fluorine ions and/or carbon ions, in the interface between the films, 11 and 12. Also, the dry-etching, such as RIE technique, may effectively reduce dispersion in the inclined angle in the side of the opening 11c in the first SiN film 11. FIG. 7 is a photograph around the openings, 11c and 12c, of the SiN films, 11 and 12, which is taken by the scanning electron microscope (SEM). Referring to FIG. 7, the openings, 11c and 12c, has respective edges inclined with the surface of the cap layer 6, in particular, the edge of the opening 11c in the first SiN film 11 causes an angle smaller than an angle determined by the aspect ratio of the etching rates for the first SiN film 11.

The aspect ratio $A_1$ in the etching rates for the first SiN film 11 may have a ratio ($A_1/A_2$) against the aspect ratio $A_2$ in the etching rates for the second SiN film 12 that is greater than 16/5, which may further expose the surface of the first SiN film 11 during the formation of the opening 11c and securely control the inclined angle of the side in the opening 11c.

The first SiN film 11 may have a thickness of 20 to 50 nm while the second SiN film 12 may have a thickness of 30 to 500 nm. The first SiN film with the thickness of 20 to 50 nm may securely show a function to passivate or protect the semiconductor stack 7. Also, the second SiN film 12 with the thickness greater than 250 nm may securely retreat the edge of the opening 12a during the formation of the openings, 11c and 12c. Thinner first and second SiN films, 11 and 12, may enhance the dimensional accuracy of the openings, 11c and 12c.

The inclined angle θ of the edge of the opening 11c may be smaller than $\tan^{-1}(8)$, which is around 70°. Assuming the first SiN film 11 in the top surface beneath the overhang formed by the patterned photoresist 30 is not etched during the formation of the opening 11c thereof, the aspect ratio $a_2/b_2$ in the etching rates thereof becomes around 8. However, the surface beneath the overhang is practically and substantially etched. Accordingly, the arrangement of the two SiN films, 11 and 12, and the patterned photoresist 30 may form the inclined edge of the opening 11c in the first SiN film 11 by the angle θ smaller than $\tan^{-1}(8)$.

The second SiN film 12 in the opening 12c thereof may retreat greater than 0.15 μm from the edge of the opening 11c in the first SiN film 11. The surface of the first SiN film 11 exposed within the opening 12c in the second SiN film 12 may be covered with the gate metal, 23A to 23C, which may reliably show the function of the inclined edge of the opening 11c in the first SiN film 11.

Advantages of the process of forming the gate electrodes, 23B and 23C using the tri-layered photoresist mask 40 may be compared with a conventional process using a two-layered photoresist that omits the lower photoresist 41; that is, the two-layered photoresist only provides an overhang formed by the upper photoresist 43 and the intermediate photoresist 42. Because the opening 42a in the intermediate photoresist 42 is formed by immersing the intermediate photoresist 42 within an alkali solution, the opening 42a in a width thereof strongly depends on conditions of such a wet-process, which increases the dispersion of the width of the opening 42a in the intermediate photoresist 42 and disperse the overlapping length of the gate electrode, 23A to 23C, with the second SiN film 12. Thus, the function to moderate the field strength at the edge of the gate electrode, 23A to 23C, for the cap layer 6 is also dispersed.

The process according to the second embodiment of the present invention, contrary to the conventional process, the EB exposure and the subsequent development of the lower photoresist 41 may form the opening 41a in the lower photoresist 41 precisely. Moreover, the opening 12c in the second SiN film 12 may be also formed during the formation of the opening 11c in the first SiN film 11 by the RIE process, which may determine the width $L_2$ of the opening 12c in the second SiN film 12. Thus, the process according to the present invention may precisely determine the overlapping length of the gate electrode, 23A to 23C, with the first SiN film 11, which may securely show the function of moderating the field strength at the edge of the gate electrode, 23A to 23C, with reduced dispersion.

In the process according to the third embodiment of the present invention, the tri-layered photoresist mask 40 is used for forming the openings, 12c and 11c, in the second and first SiN films, 12 and 11, and for depositing the gate metal 23C within the openings, 11c and 12c. Thus, the process of the third embodiment is unnecessary to carry out the photolithography twice, one is for forming the openings, 11c and 12c, in the first and second SiN films, 11 and 12, and the other is for depositing the gate metal, where those steps are carried out in the process of the second embodiment. Moreover, the process of the third embodiment may securely determine the overlapping length of the gate metal with the first SiN film 11. Although the process of the third embodiment widens the opening 41a in the lower photoresist 41 by a wet-process, namely, the second development of the lower photoresist 41, the amount of the retreat of the lower photoresist 41 may be determined by the RIE process of forming the openings, 11c and 12c, in the first and second SiN films, 11 and 12. Thus, the overlapping length of the gate metal 23C with the first SiN film 11 may be precisely determined by the dry-process.

In the foregoing detailed description, the process of forming an FET according to the present invention have been described with reference to specific exemplary embodiments thereof. However, it will be evident that various modifications and changes may be made thereto without departing from the broader spirit and scope of the present invention. For instance, although the FET has the type of HEMT, the process of forming the gate electrode may be applicable to other types of FETs. Also, the embodiment forms the second SiN film after the formation of the ohmic electrodes, but the second SiN film may be formed before the formation of the ohmic electrode. In such a process, the ohmic electrode is preferable to secure a gap against the second SiN film, that is, the ohmic electrode is preferably apart from the second SiN film. Accordingly, the present specification and figures are accordingly to be regarded as illustrative rather than restrictive.

What is claimed is:

1. A process of forming a field effect transistor (FET) having a gate electrode, comprising steps of:
    depositing a first silicon nitride (SiN) film on a semiconductor layer by a low pressure chemical vapor deposition (LPCVD) technique;
    depositing a second SiN film on the first SiN film by a plasma assisted chemical vapor deposition (p-CVD) technique;
    preparing a photoresist mask on the second SiN film, the photoresist mask having an opening in a position corresponding to the gate electrode;
    dry-etching the second SiN film and the first SiN film continuously in a portion of the opening in the photoresist mask to form an opening in the first SiN film and an opening in the second SiN film, the openings in the first and second SiN films exposing the semiconductor layer; and
    filling at least the opening in the first SiN film by the gate electrode,
    wherein the opening in the first SiN film has an inclined side against the semiconductor layer and gradually widens from the semiconductor layer.

2. The process according to claim 1,
    wherein the step of dry-etching is carried out by reactive ion etching (RIE) with conditions.

3. The process according to claim 2,
    wherein the step of dry-etching is carried out under the condition of $(a_1/b_1)/(a_2/b_2)$ greater than 16/5, where $a_1$ and $b_1$ are etching rates for the first SiN film in a thickness direction and a surface direction, respectively, and $a_2$ and $b_2$ are etching rates for the second SiN film in the thickness direction and the surface direction, respectively.

4. The process according to claim 3,
    wherein the step of dry-etching forms the opening in the first SiN film with a side inclined by an angle of at least $\tan^1(8)$ against the semiconductor layer.

5. The process according to claim 3,
    wherein the angle of the side of the opening in the first SiN film against the semiconductor layer is smaller than an angle of a side of the opening in the second SiN film against the semiconductor layer.

6. The process according to claim 1,
    wherein the step of depositing the first SiN film deposits the first SiN film by a thickness of 20 to 50 nm at a temperature of 800 to 900° C. and a pressure of 50 to 100 Pa using di-chloro-silane ($SiH_2Cl_2$) and ammonia ($NH_3$) with a ratio of flow rates thereof greater than 0.1.

7. The process according to claim 6,
wherein the step of depositing the first SiN film forms the first SiN film with Si rich compositing from a stoichiometric compositing thereof.

8. The process according to claim 1,
wherein the step of depositing the second SiN film deposits the second SiN film by a thickness of 30 to 500 nm at a temperature of 300 to 350° C.

9. The process according to claim 8,
wherein the step of depositing the second SiN film deposits the second SiN film with a Si composition smaller than a Si composition of the first SiN film.

10. The process according to claim 1,
wherein the step of dry-etching is carried out such that the opening in the second SiN film in an end thereof retreats from the opening in the first SiN film to expose a surface of the first SiN film in a periphery of the opening in the first SiN film.

11. The process according to claim 1,
further including, after the step of dry-etching, a step of preparing another photoresist mask that includes a lower photoresist on the second SiN film, an intermediate photoresist on the lower photoresist, and an upper photoresist on the intermediate photoresist,
wherein the lower photoresist, the intermediate photoresist, and the upper photoresist provide respective openings, the opening in the lower photoresist exposing the openings of the second SiN film and the first SiN film, the opening in the intermediate photoresist exposing the opening in the lower photoresist, and the opening in the upper photoresist exposing the opening in the lower photoresist but hiding the opening in the intermediate photoresist to form an overhang against the intermediate photoresist.

12. The process according to claim 11,
wherein the step of filling fills the opening in the first SiN film and the opening in the second SiN film, the gate electrode partially overlapping with the second SiN film around the opening in the second SiN film.

13. The process according to claim 1,
wherein the step of preparing the photoresist mask prepares a lower photoresist, an intermediate photoresist, and an upper photoresist, the lower photoresist providing an opening, the intermediate photoresist providing an opening fully covering the opening in the lower photoresist, and the upper photoresist providing an opening fully covering the opening in the lower photoresist but hiding the opening in the intermediate photoresist to form an overhang against the intermediate photoresist,
wherein the step of dry-etching includes etching the second SiN film and the first SiN film exposed within the opening in the lower photoresist, and
wherein the process further includes, after the step of dry-etching but before the step of filling at least the opening in the first SiN film, a step of expanding the openings of the upper photoresist and the lower photoresist by immersing the photoresist mask within a developer for the upper photoresist and the lower photoresist.

14. The process according to claim 13,
wherein the opening in the lower photoresist is narrower than the opening in the second SiN film, and
wherein the step of filling at least the opening in the first SiN film fills the opening in the lower photoresist but forms a gap against the opening in the second SiN film.

15. The process according to claim 13,
wherein the opening in the lower photoresist is wider than the opening in the second SiN film, and
wherein the step of filling at least the opening in the first SiN film fills the opening in the lower photoresist and the opening in the second SiN film, the gate metal being in contact with the second SiN film and partially covering a surface of the second SiN film around the opening thereof.

16. The process according to claim 13,
wherein the step of preparing the photoresist mask prepares the lower, intermediate, and upper photoresists with respective thicknesses substantially equal to each other.

* * * * *